(12) United States Patent
Chen et al.

(10) Patent No.: US 7,713,854 B2
(45) Date of Patent: May 11, 2010

(54) GATE DIELECTRIC LAYERS AND METHODS OF FABRICATING GATE DIELECTRIC LAYERS

(75) Inventors: Chi-Chun Chen, Kaohsiung (TW); Matt Yeh, Hsinchu (TW); Shih-Chang Chen, Hsin-Chu (TW); Mong-Song Liang, Hsin-Chu (TW); Jennifer Chen, Hsinchu (TW); Da-Yuan Lee, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 521 days.

(21) Appl. No.: 11/551,577

(22) Filed: Oct. 20, 2006

(65) Prior Publication Data

US 2008/0096394 A1   Apr. 24, 2008

(51) Int. Cl.
*H01L 21/3205* (2006.01)

(52) U.S. Cl. ............................. 438/585; 257/E21.248; 257/E21.277

(58) Field of Classification Search .................. 438/758, 438/585; 257/E21.248, E21.277, E21.274
See application file for complete search history.

(56) References Cited

U.S. PATENT DOCUMENTS

| | | | |
|---|---|---|---|
| T954,009 I4 | 1/1977 | Malin et al. | |
| 4,140,548 A | 2/1979 | Zimmer | |
| 4,992,840 A | 2/1991 | Haddad et al. | |
| 6,146,948 A * | 11/2000 | Wu et al. | 438/275 |
| 6,235,559 B1 | 5/2001 | Kuo | |
| 6,268,269 B1 * | 7/2001 | Lee et al. | 438/473 |
| 6,890,811 B2 | 5/2005 | Hou et al. | |
| 6,967,130 B2 | 11/2005 | Chen et al. | |
| 6,998,303 B2 * | 2/2006 | Sugita et al. | 438/199 |
| 7,018,879 B2 | 3/2006 | Wang et al. | |
| 2001/0025998 A1 * | 10/2001 | Tsuchiaki | 257/402 |
| 2002/0187644 A1 * | 12/2002 | Baum et al. | 438/700 |
| 2005/0054150 A1 | 3/2005 | Mirabedini et al. | |
| 2007/0178633 A1 * | 8/2007 | Adetutu et al. | 438/199 |
| 2007/0178713 A1 * | 8/2007 | Jeng | 438/787 |

* cited by examiner

*Primary Examiner*—Davienne Monbleau
*Assistant Examiner*—Shweta Mulcare
(74) *Attorney, Agent, or Firm*—Duane Morris LLP (57) ABSTRACT

A method of forming a gate dielectric layer includes forming a gate dielectric layer over a substrate. The gate dielectric layer is processed with carbon-containing ions. The gate dielectric layer is thermally processed, thereby providing the gate dielectric layer with a level of carbon between about 1 atomic % and about 20 atomic %.

16 Claims, 13 Drawing Sheets

GATE DIELECTRIC LAYERS AND METHODS OF FABRICATING GATE DIELECTRIC LAYERS

BACKGROUND OF THE INVENTION

1. Field of the Invention

The present invention relates to semiconductor structures and methods of forming semiconductor structures, and more particularly to gate dielectric layers and methods of fabricating gate dielectric layers.

2. Description of the Related Art

With advances associated with electronic products, semiconductor technology, has been widely applied in manufacturing memories, central processing units (CPUs), liquid crystal displays (LCDs), light emission diodes (LEDs); laser diodes and other devices or chip sets. In order to achieve high integration and speed targets, dimensions of semiconductor integrated circuits, such as gate dielectric layers, continue shrinking and various materials, such as high-k dielectric materials, have been used along with techniques for overcoming manufacturing obstacles associated with these materials.

Figure 1:
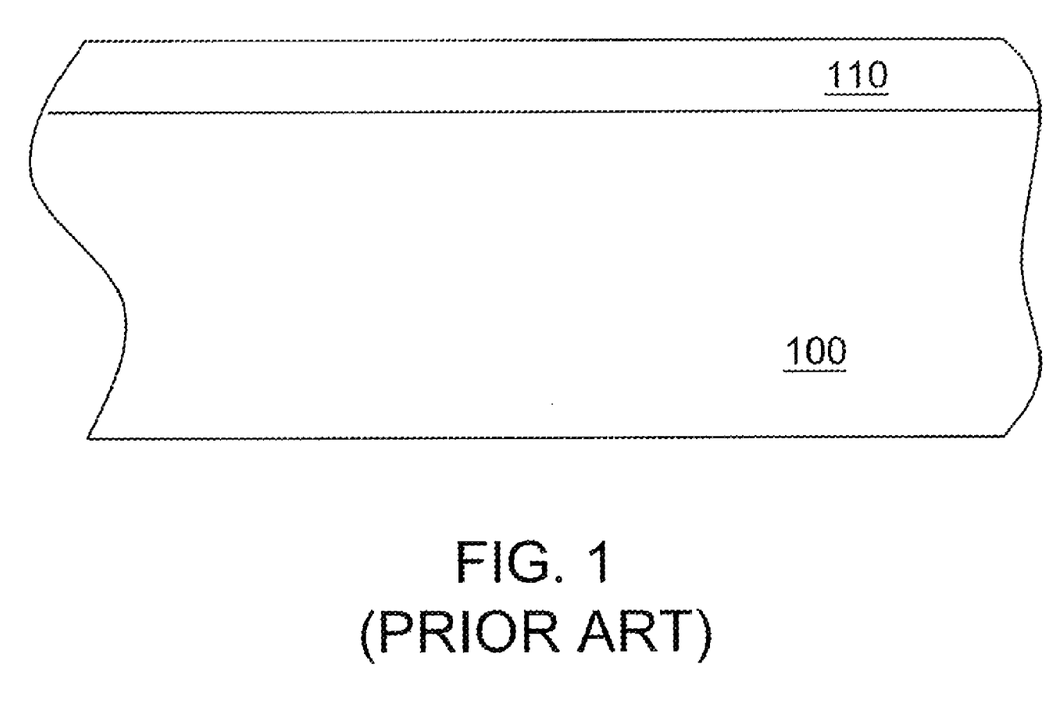
FIG. 1 is a cross-sectional view of a prior art high-k gate dielectric layer formed over a substrate.

FIG. 1 is a cross-sectional view of a prior art high-k gate dielectric layer formed over a substrate. A high-k gate dielectric layer 110 is formed over a substrate 100. The high-k gate dielectric layer 110 includes ions, such as nitrogen (N), hafnium (Hf) or zirconium (Zr), which increases the dielectric constant of the high-k gate dielectric layer 110. For example, a dielectric constant of a gate oxide layer is about 3.9 and a dielectric constant of an $HfO_2$ layer is about 22. A high-k dielectric layer having a high physical thickness provides a desired equivalent oxide thickness (EOT) to that provided by an oxide layer having a low physical thickness. An oxide layer having a physical thickness of about 15 Å provides an EOT of about 15 Å. An $HfO_2$ layer providing an EOT of about 15 Å, however, may have a physical thickness of about 85 Å. The $HfO_2$ layer having an 85-Å physical thickness can tolerate a high gate voltage applied thereto. Accordingly, a transistor having an $HfO_2$ layer as a gate dielectric layer not only provides the same electrical performance as a transistor having a 15-Å oxide layer, but also has a current leakage lower than the transistor having the oxide dielectric layer.

By way of background, U.S. Pat. No. 6,268,269 provides a description of a process for reducing interface-trapped charges, the entirety of which is hereby incorporated by reference herein. U.S. Pat. No. 4,140,548 provides a description of a process for manufacturing metal-oxide-semiconductor (MOS) devices, the entirety of which is also hereby incorporated by reference herein.

From the foregoing, improved gate dielectric layers and methods of forming gate dielectric layers are desired.

SUMMARY OF THE INVENTION

In accordance with some exemplary embodiments, a method of forming a gate dielectric layer includes forming a gate dielectric layer over a substrate. The gate dielectric layer is processed with carbon-containing ions. The gate dielectric layer is thermally processed, thereby providing the gate dielectric layer with a level of carbon between about 1 atomic % and about 20 atomic %.

The above and other features of the present invention will be better understood from the following detailed description of the preferred embodiments of the invention that is provided in connection with the accompanying drawings.

BRIEF DESCRIPTION OF THE DRAWINGS

Following are brief descriptions of exemplary drawings. They are mere exemplary embodiments and the scope of the present invention is not limited thereto.

DESCRIPTION OF THE PREFERRED EMBODIMENT

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

FIGS. 2A-2E are schematic cross-sectional views of a first exemplary process for formation of a gate dielectric layer over a substrate.

Figure 2A:
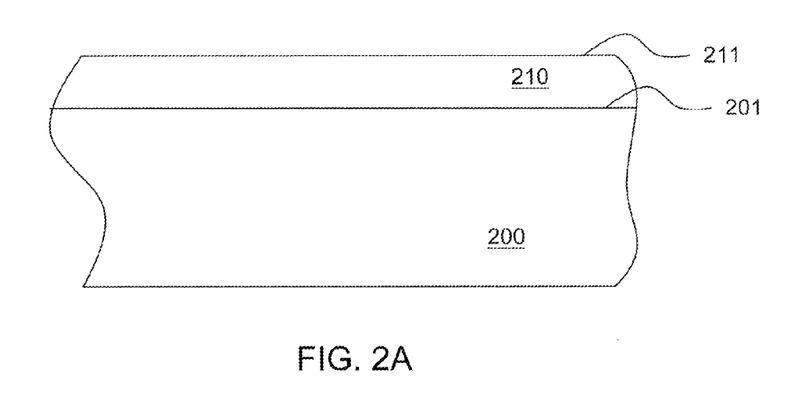
FIGS. 2A-2E are cross-sectional views of a first exemplary process for formation of a gate dielectric layer over a substrate.

As shown in FIG. 2A, a gate dielectric layer 210, such as an oxide layer, nitride layer or oxynitride layer, is formed over a substrate 200. The substrate 200 can be a P-type or N-type silicon substrate, III-V compound substrate, display substrate such as a liquid crystal display (LCD), plasma display, cathode ray tube display or electro luminescence (EL) lamp display, or light emitting diode (LED) substrate (collectively referred to as, substrate 200), for example. The gate dielectric layer 210 can be formed by a thermal oxidation process or chemical vapor deposition (CVD) process. For embodiments that include forming a thermal oxide layer, oxygen ($O_2$) and/or hydrogen dioxide ($H_2O$) are provided as reactants for reacting with the substrate 200, thereby forming the gate dielectric layer 210 over the substrate 200. For other embodiments with a CVD oxide layer, silane-based chemical (e.g., $SiH_4$ Or $SiH_2Cl_2$) and $O_2$ or $N_2O$ are provided as reactants for forming the gate dielectric layer 210 over the substrate 200. In some embodiments using 45-nm technology, the gate dielectric layer 210 is formed to be about 14 Å or more so that the gate dielectric layer 210 is able to tolerate a voltage applied to a transistor gate (not shown) formed over the gate dielectric layer 210.

Figure 2B:
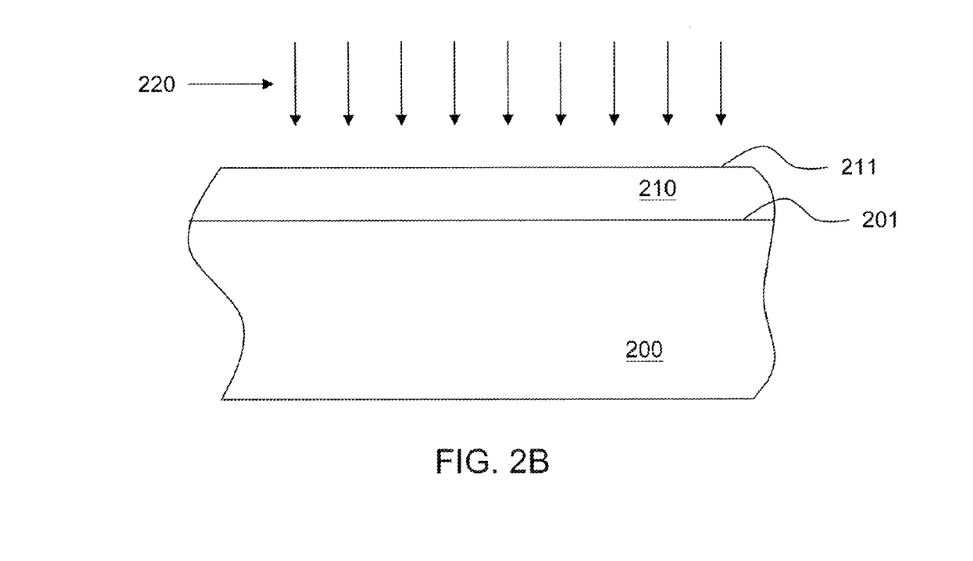
Figure 2C:
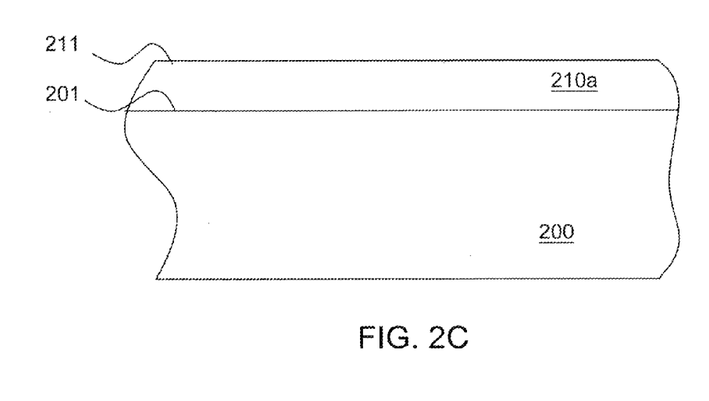
Figure 2D:
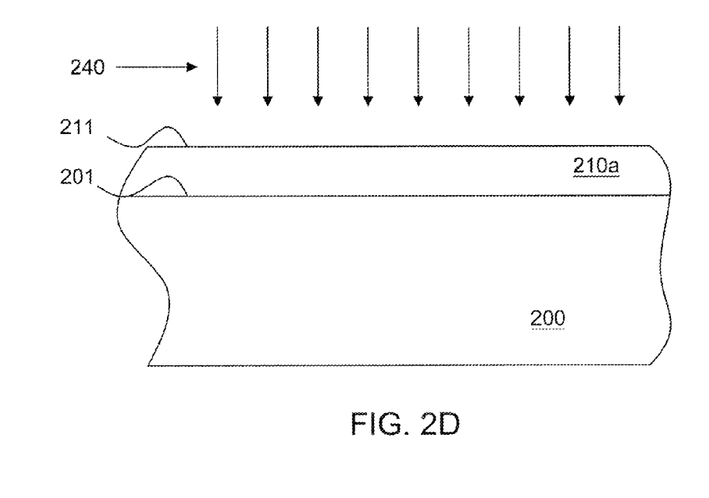
Figure 2E:
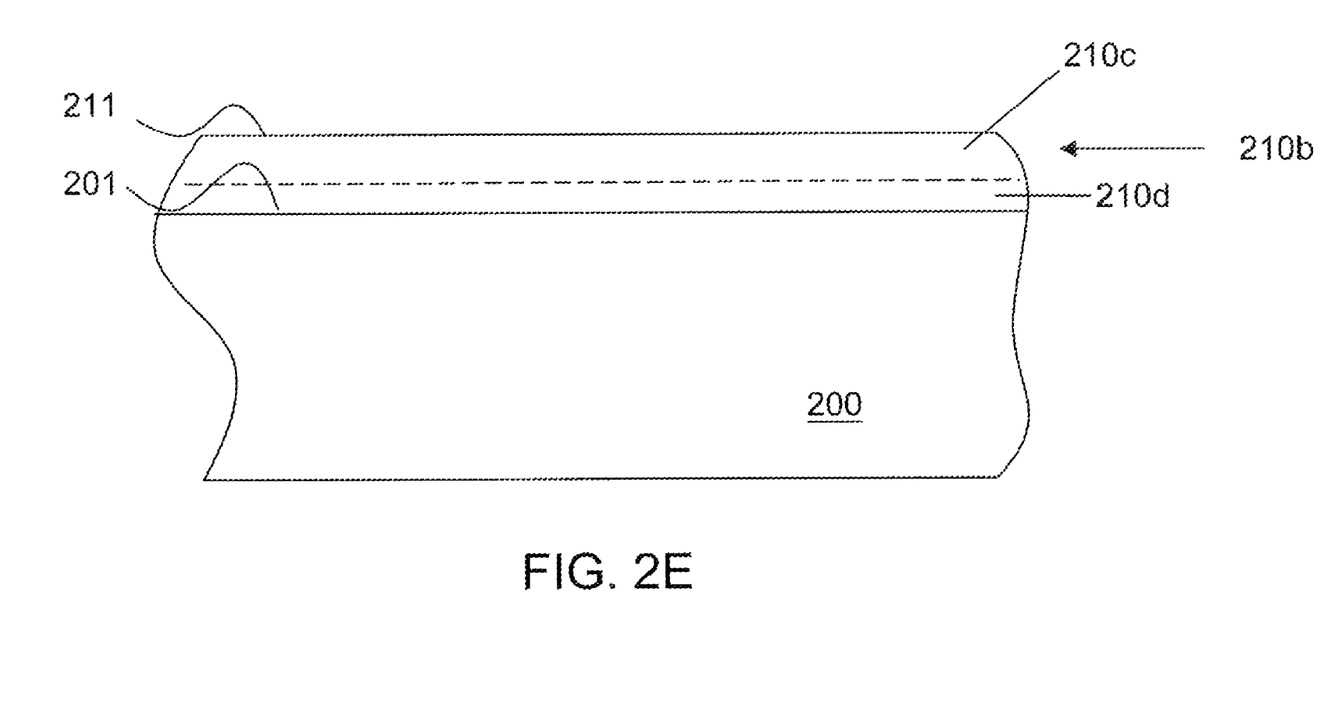
Figure 2F:
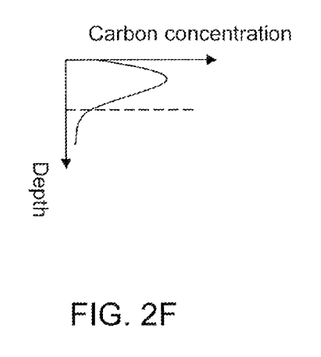
FIG. 2F is a schematic drawing of a distribution profile of carbon within an exemplary gate dielectric layer.

A process 220 (FIG. 2B) is then performed to process the gate dielectric layer 210 with carbon-containing ions, such as carbon ions. The processed gate dielectric layer is indicated by the numeral 210a (FIG. 2C). The process 220 may comprise, for example, an ion implantation process or plasma process as shown in FIG. 2B. In some embodiments of using an ion implantation process, the ion implantation process has an implantation energy of between about 0.5 KeV and about 8 KeV, so that a peak of the distribution profile of carbon is located between the top surface 211 of the gate dielectric layer 210 and the top surface 201 of the substrate 200 as shown in FIG. 2F. For embodiments using 45-nm technology, the peak of the distribution profile of carbon is formed between about 5 Å and about 10 Å from the top surface 211 of the gate dielectric layer 210. The ion implantation process may also comprise an implantation dosage of carbon between about $1\times10^{14}/cm^2$ and about $1\times10^{16}/cm^2$. The distribution profile of carbon relates to the thickness of the gate dielectric layer 210 and the implantation energy of the implantation process. The distribution profile of carbon within the gate dielectric layer 210 may provide a desired dielectric constant of the gate dielectric layer 210. In some embodiment, the distribution profile of carbon also provides a desired interface quality between the gate dielectric layer 210 and the substrate 200. One of ordinary skill in the art can readily adjust the implantation energy based upon the thickness of the gate dielectric layer 210, thereby obtaining a desired distribution profile of carbon within the gate dielectric layer 210.

In other embodiments using a plasma process to introduce carbon into the gate dielectric layer 210, the plasma process has a plasma power of between about 5 watts and about 1,500 watts. The plasma process may comprise, for example, a plasma immersion ion implantation (PIII) process, decoupling plasma carbon (DPC) process or other plasma process that is able to incorporate carbon into the gate dielectric layer 210.

In some embodiments, the gate dielectric layer 210a may comprise a level of carbon between about 1 atomic % and about 20 atomic %. The carbon-containing gate dielectric layer 210a as shown in FIG. 2C has a desired equivalent oxide thickness (EOT). For embodiments with a gate dielectric layer having a physical thickness of about 14 Å, the equivalent oxide thickness of the gate dielectric layer 210a is between about 6 Å and about 8 Å. With this equivalent oxide thickness, the transistor having the gate dielectric layer 210a can provide desired electrical performance and the gate dielectric layer 210a can desirably reduce or prevent current leakage.

In some embodiments, another process 240 (FIG. 2D) is performed to process the gate dielectric layer 210a with at least one ion source, such as nitrogen (N), germanium (Ge), calcium (Ca), scandium (Sc), strontium (Sr), yttrium (Y), lanthanum (La), aluminum (Al), tantalum (Ta), titanium (Ti), niobium (Nb), zirconium (Zr), hafnium (Hf) or other ion source that is capable of increasing the dielectric constant of the gate dielectric layer 210a and/or preventing doping penetration, for example boron penetrating, of following implantation process on the transistor. After the process 240, the gate dielectric layer is indicated by the numeral 210b (FIG. 2E). In some embodiments, the gate dielectric layer 210b comprises a top region 210c, in which most of the ions introduced by the process 240 are found, and a bottom region 210d comprising fewer ions than the top region 210c. In some embodiments, the process 240 comprises an ion implantation process. The ion implantation process has an implantation energy of between about 0.5 KeV and about 8 KeV so that a peak of the distribution profile of this ion is found within the region 210c of the gate dielectric layer 210b as shown in FIG. 2E. For embodiments using 45-nm technology, the peak of the distribution profile of carbon is formed between about 5 Å and about 10 Å from the top surface 211 of the gate dielectric layer 210b. The ion implantation process may also comprise an implantation dosage of at least one of these ions between about $1\times10^{14}/cm^2$ and about $1\times10^{16}/cm^2$. The distribution profile of this ion relates to the desired thickness of the region 210c and the implantation energy of the implantation process. One of ordinary skill in the art can readily adjust the implantation energy based upon the desired thickness of the region 210c of the gate dielectric layer 210b, thereby obtaining a desired distribution profile of the ion within the gate dielectric layer 210b.

In other embodiments, the process 240 comprising a plasma process is performed to process the gate dielectric layer 210a. In some embodiments, the plasma process has a plasma power of between about 5 watts and about 1,500 watts. The plasma process may comprise, for example, a plasma immersion ion implantation (PIII) process, decoupling plasma carbon (DPC) process or other plasma process that is able to introduce ions into the gate dielectric layer 210b.

As shown in FIG. 2E, the ions that can enhance the dielectric constant of the gate dielectric layer 210b are substantially incorporated into the region 210c, instead of the region 210d. In some embodiments, the region 210c of the gate dielectric layer 210b may comprise a level of ions between about 1 atomic % and about 20 atomic %. The ion-containing gate dielectric layer 210b as shown in FIG. 2E may provide a desired equivalent oxide thickness. With this equivalent oxide thickness, the transistor having the gate dielectric layer 210b can provide desired electrical performance and the gate dielectric layer 210b can desirably reduce or prevent current leakage therethrough. The step shown in FIG. 2D may be omitted, if the carbon-containing gate dielectric layer 210a can provide a desired dielectric characteristic and/or equivalent oxide thickness without the additional process step 240.

After the formation of the carbon-containing gate dielectric layer 210a as shown in FIG. 2C or the ion-containing gate dielectric layer 210b as shown in FIG. 2E, an annealing process (not shown) is performed to cure damage caused by the ion implantation process or plasma process described above. The annealing process can be performed by, for example, a furnace, single-wafer rapid thermal process (RTP) apparatus, spike annealing apparatus or flash annealing apparatus, or other heating technique. For embodiments using a furnace, the annealing process comprises a processing temperature of between about 600° C. and about 1,100° C., preferably about 900° C., and a processing time of between about 10 minutes and about 180 minutes. For embodiments using a rapid thermal process (RTP) apparatus, the annealing process comprises a processing temperature of between about 600° C. and about 1,100° C., preferably about 900° C., and a processing time of between about 5 seconds and about 240 seconds. For embodiments using a spike annealing apparatus, the spike annealing process has a processing temperature of between about 400° C. and about 1,100° C. and a processing time of between about 1 millisecond and about 1 second. For embodiments using a flash annealing apparatus, the flash annealing process has a processing temperature of between about 400° C. and about 1,100° C. and a processing time of about 1 millisecond or less.

For some embodiments, a gate dielectric layer is formed over a substrate, wherein the gate dielectric layer comprises a level of carbon between about 1 atomic % and about 20 atomic % and the level of carbon is provided therein before the gate dielectric layer is completely formed. In other words, carbon is provided to the substrate either while the formation of the gate dielectric layer or before the formation of the gate dielectric layer.

FIGS. 3A-3D are schematic cross-sectional views of a second exemplary process for formation of a gate dielectric layer over a substrate. Like items 300a, 301a, 310, 320, 321, 330, 320a, 320b and 320c shown in FIGS. 3A-3D are the same as or analogous to items 200, 201, 220, 210a, 211, 240, 210b, 210c and 210d shown in FIGS. 2A-2E, respectively.

Figures 3A, 3B, 3E, 3F:
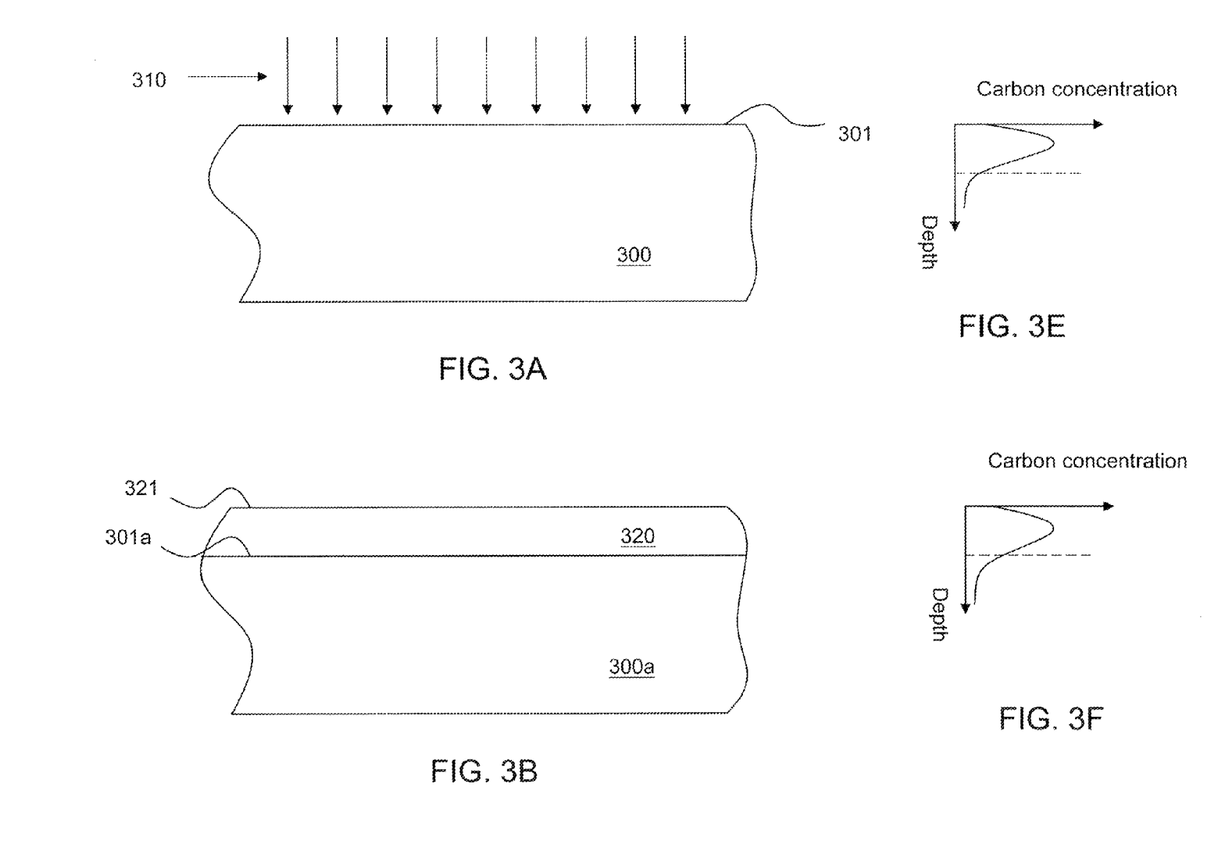
FIGS. 3A-3D are cross-sectional views of a second exemplary process for formation of a gate dielectric layer over a substrate.
FIGS. 3E-3F are schematic drawings of distribution profiles of carbon within a substrate and an exemplary gate dielectric layer, respectively.

In these embodiments, the substrate 300 is subjected to the process 310 with carbon-containing ions. The process 310 may comprise, for example, an implantation process or plasma process. Carbon ions introduced by the process 310 are retained near to the top surface 301 of the substrate 300 with the distribution profile shown in FIG. 3E. After the process 310, the gate dielectric layer 320 is formed over the substrate 300. The gate dielectric layer 320 may be formed by, for example, a thermal process with $O_2$ and/or $H_2O$. $O_2$ and $H_2O$ not only react with the surface 301 of the substrate 300, but also diffuse into the substrate 300. A part of the gate dielectric layer 320, which is formed from the reaction of the top surface 301 of the substrate 300 and $O_2$ and/or $H_2O$ will extend upward. Another part of the gate dielectric layer 320, which is formed from the reaction of diffusing $O_2$ and/or $H_2O$ and the substrate 300 will extend downward. After the thermal oxidation process, the top surface 301a of the substrate 300a shown in FIG. 3B is slightly lower than the top surface 301 of the substrate 300 shown in FIG. 3A. The distribution profile of carbon shown in FIG. 3E may be substantially similar to that shown in FIG. 3F, even if the thermal oxidation process may drive carbon ions slightly toward the substrate 300a.

Figure 3C:
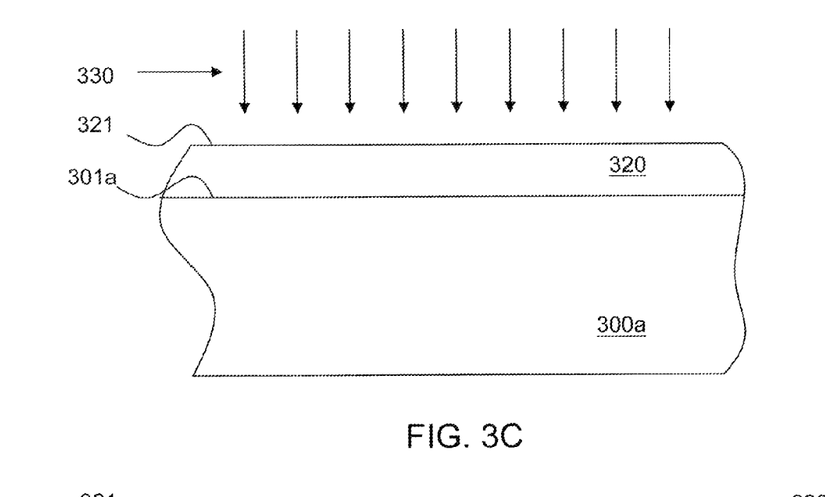
Figure 3D:
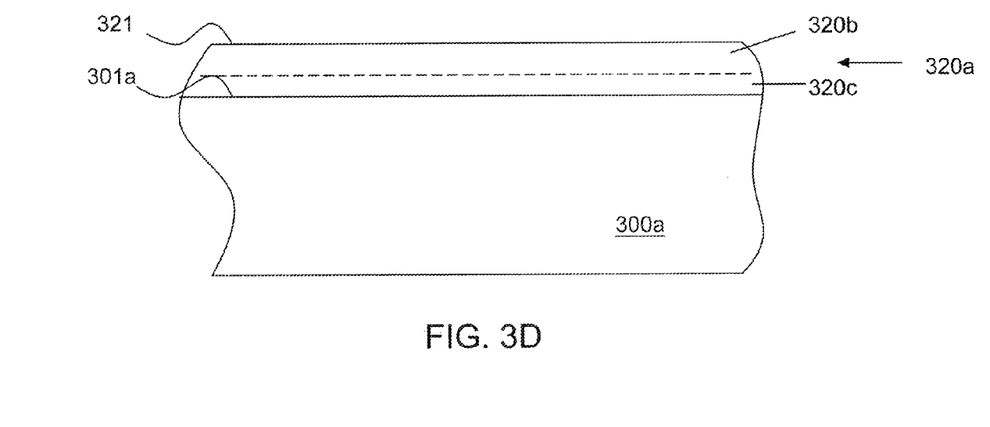

In some embodiments, a process 330, such as ion implantation process or plasma process, is performed to introduce ion source, such as nitrogen (N), germanium (Ge), calcium (Ca), scandium (Sc), strontium (Sr), yttrium (Y), lanthanum (La), aluminum (Al), tantalum (Ta), titanium (Ti), niobium (Nb), zirconium (Zr), hafnium (Hf) or other ion source that is capable of increasing the dielectric constant of the gate dielectric layer 320, into the gate dielectric layer 320 as shown in FIG. 3C. In another embodiment, the another process 330 using an ion source, such as nitrogen (N), to process the gate dielectric layer 320 that is capable of is capable of not only increasing the dielectric constant of the gate dielectric layer 320 but also preventing doping penetration, for example boron penetrating, of following implantation process on the transistor. A doped gate dielectric layer 320a as shown in FIG. 3D is thus formed. As set forth above, this step shown in FIG. 3C can be omitted if a desired gate dielectric constant of the gate dielectric layer 320 can be obtained in the process shown in FIG. 3B.

After the formation of the carbon-containing gate dielectric layer 320 as shown in FIG. 3B or the ion-containing gate dielectric layer 320a as shown in FIG. 3D, an annealing process (not shown) is performed to cure damage caused by the ion implantation process or plasma process described above. In some embodiments, the annealing process is the same as or similar to the annealing process described in connection with FIGS. 2A-2E.

FIGS. 4A-4D are schematic cross-sectional views of a third exemplary process for formation of a gate dielectric layer over a substrate. Like items 40, 401, 410, 411, 410a, 410b, 410c and 420 shown in FIGS. 4A-4D are the same as or similar to items 200, 201, 210a, 211, 210b, 210c, 210d and 240 shown in FIGS. 2A-2E, respectively.

Figure 4A:
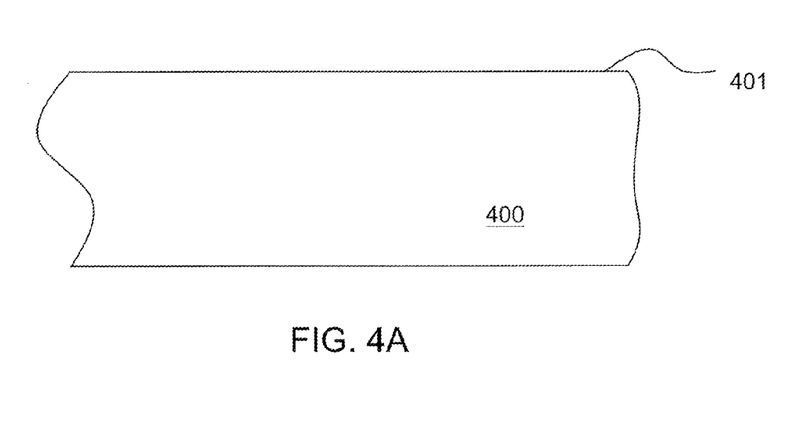
FIGS. 4A-4D are cross-sectional views of a third exemplary process for formation of a gate dielectric layer over a substrate.
Figure 4B:
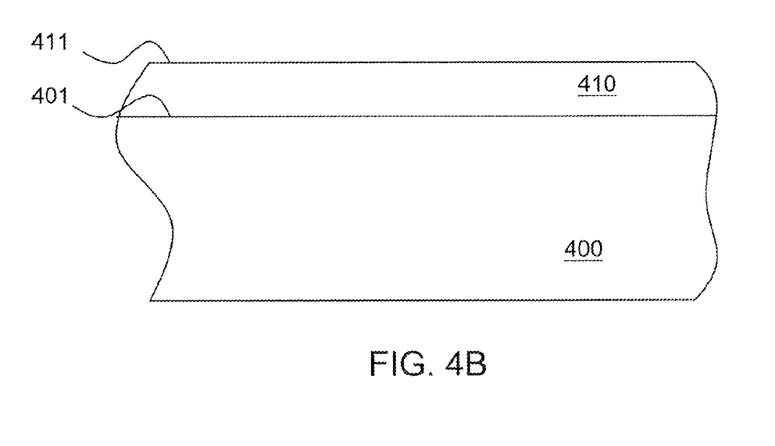

As shown in FIG. 4A, the substrate 400 having the top surface 401 is provided. The gate dielectric layer 410 comprising the top surface 411 is then formed over the substrate 400 as shown in FIG. 4B. The gate dielectric layer 410 may be formed by, for example, a thermal process or CVD process. In some embodiments using a thermal oxidation process, CO, $CO_2$, $CH_4$ and/or other carbon-containing gas is provided as reactant gas that is mixed with $O_2$ and/or $H_2O$ for forming the gate dielectric layer 410. CO, $CO_2$, $CH_4$ and/or other carbon-containing gas provides carbon in this thermal process so as to form the carbon-containing gate dielectric layer 410. For other embodiments using a CVD process, such as atomic layer CVD (ALCVD) process, a silane-based chemical, such as $SiH_4$ or $SiH_2Cl_2$, reacts with CO, $CO_2$, $CH_4$ and/or other carbon-containing gas to form the carbon-containing gate dielectric layer 410. In some embodiments, the flow rate of $O_2$ and/or $H_2O$ is about 10 standard liter per minute (slm). The flow rate of CO, $CO_2$, $CH_4$ and/or other carbon-containing gas may be, for example, between about 1 slm and about 10 slm.

Figure 4C:
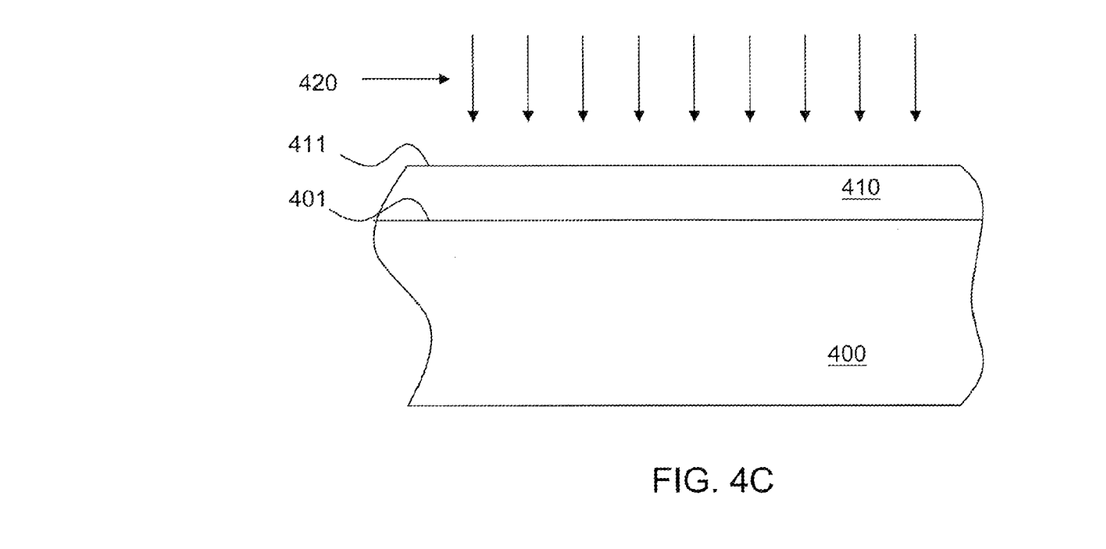
Figure 4D:
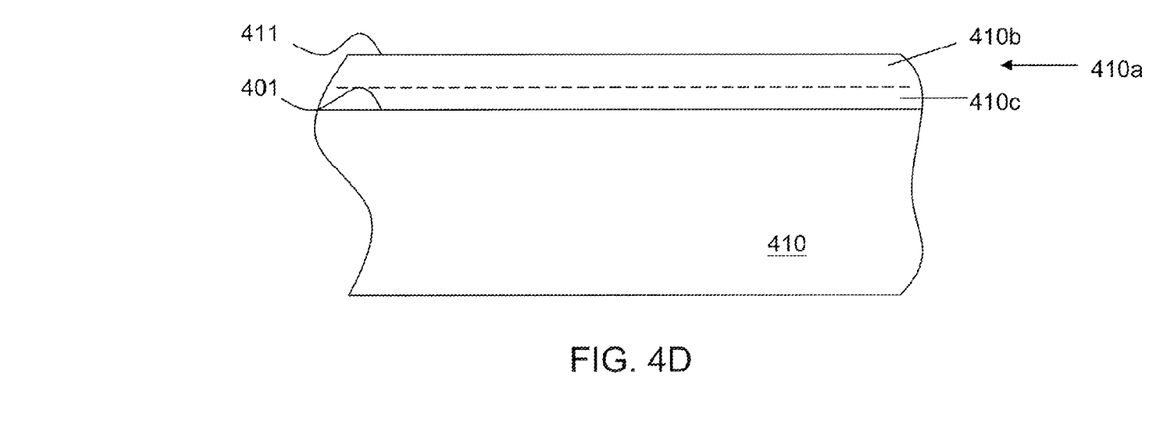
Figure 4E:
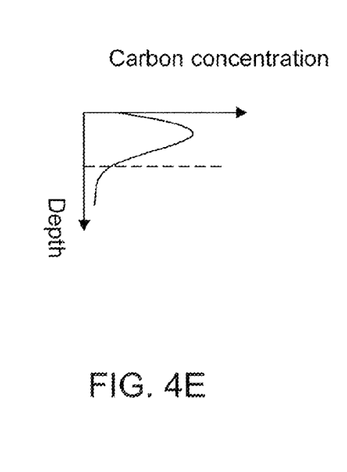
FIG. 4E is a schematic drawing of a distribution profile of carbon within an exemplary gate dielectric layer.

In some embodiments, the carbon-containing gate dielectric layer 410 may be formed by the thermal process or CVD process so that the peak of the distribution profile of carbon can be formed between the top surface 411 of the gate dielectric layer 410 and the top surface 401 of the substrate 400 as shown in FIG. 4E. For example, a low flow rate (e.g., about 1 slm) of CO, $CO_2$, $CH_4$ and/or other carbon-containing gas is introduced into a process chamber (not shown) at the beginning of the process. A high flow rate (e.g., about 10 slm) of CO, $CO_2$, $CH_4$ and/or other carbon-containing gas is then introduced in the process chamber so that the peak of the peak of the distribution profile of carbon can be located within the gate dielectric layer 410.

In some embodiments, another process 420, such as ion implantation process or plasma process, is performed to incorporate other ion source such as nitrogen (N), germanium (Ge), calcium (Ca), scandium (Sc), strontium (Sr), yttrium (Y), lanthanum (La), aluminum (Al), tantalum (Ta), titanium (Ti), niobium (Nb), zirconium (Zr), hafnium (Hf) or other ion that is capable of increasing the dielectric constant of the gate dielectric layer 410, into the gate dielectric layer 410 as shown in FIG. 4C. In another embodiment, the another process 330 using an ion, such as nitrogen (N), to process the gate dielectric layer 320 that is capable of is capable of not only increasing the dielectric constant of the gate dielectric layer 410 but also preventing doping penetration, for example boron penetrating, of following implantation process on the transistor. A doped gate dielectric layer 410a as shown in FIG. 4D is thus formed. As set forth above, this step shown in FIG. 4C can be omitted if a desired gate dielectric constant of the gate dielectric layer 410 can be formed in the process shown in FIG. 4B.

After the formation of the carbon-containing gate dielectric layer 410 as shown in FIG. 4B or the ion-containing gate dielectric layer 410a as shown in FIG. 4D, an annealing process (not shown) is performed to cure damage caused by the ion implantation process or plasma process. In some embodiments, the annealing process is the same as or similar to the annealing process described in connection with FIGS. 2A-2E.

Figure 5A:
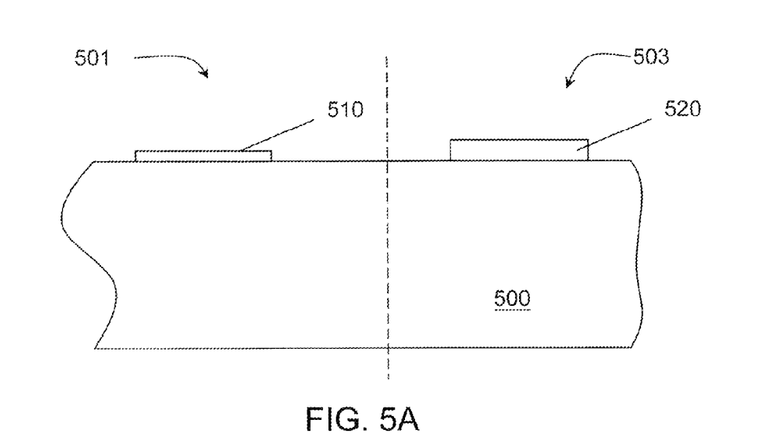
FIGS. 5A-5F are cross-sectional views of a process for formation of an exemplary dual-gate structure over a substrate.
Figure 5B:
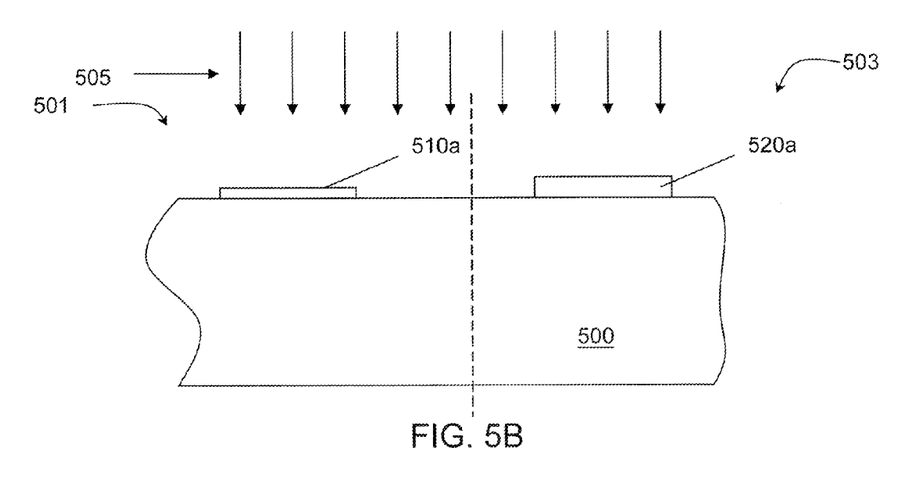
Figure 5C:
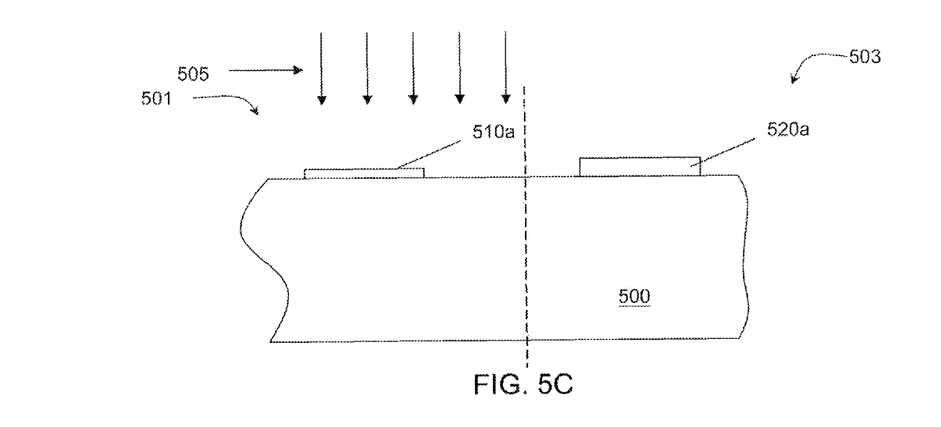

FIGS. 5A-5C are schematic cross-sectional views of a process for formation of an exemplary dual-gate dielectric structure over a substrate.

As shown in FIG. 5A, the substrate 500 comprises a first region 501 and a second region 503. The substrate 500 is analogous to the substrate 200 described in connection with FIG. 2A. The first region 501 is provided, for example, for forming a core device therein. The second region 503 is provided for forming an input/output (I/O) device therein, for example. A core device is a low-power device, using a gate dielectric layer 510, which is formed over the substrate 500. The gate dielectric layer 510 can be formed by the process described in connection with FIG. 2A, for example. An I/O device is a high-power device, having a gate dielectric layers such as gate dielectric layer 520. The gate dielectric layer 520 is physically thicker than the gate dielectric layer 510 so that the gate dielectric layer 520 can tolerate a high voltage applied thereto. The gate dielectric layer 520 can be formed by, for example, any thermal process, CVD process or process described in connection with FIG. 2A, or equivalent thereof.

In some embodiments, the gate dielectric layers 510 and 520 are formed by forming a first layer of gate dielectric (not shown) overlying the first region 501 and the second region 503 on the substrate 500, then remove the portion of the first layer of gate dielectric which is formed overlying the first region, then forming a second layer of gate dielectric (not shown) overlying the first region 501 and the second region 503, thereby forming the gate dielectric layers 10 and 520. Since the first layer of gate dielectric overlying the first region is removed, the gate dielectric layer 520 is therefore physically thicker than the gate dielectric layer 510.

In another embodiments, the gate dielectric layers 510 and 520 are formed by the same process. For example, a layer of gate dielectric material (not shown) is formed over the substrate 500. The layer of gate dielectric material has a thickness substantially similar to that of the gate dielectric layer 520. A photoresist process and an etch process are performed to partially remove the layer of gate dielectric material, thereby forming the gate dielectric layers 510 and 520.

After the formation of the dual-gate dielectric structure with the gate dielectric layers 510 and 520 having different thicknesses, a carbon-containing process 505, such as ion implantation or plasma, as described in connection with FIG. 2B is performed to process the gate dielectric layers 510 and/or 520 so as to form the carbon-containing gate dielectric layers 510a and/or 520a, respectively. Accordingly, the gate dielectric layer 520 or 520a has an EOT (e.g., less than about 10 nm or less) larger than that of the gate dielectric layer 510a (e.g., EOT is less than about 2 nm or less). In some embodiments, the gate dielectric layer 520 is not treated by the process 505, as in FIG. 5C, the process 505 was selectively performed on the gate dielectric layer 510, where the gate dielectric layer is protected by a mask layer (not shown).

Figure 5D:
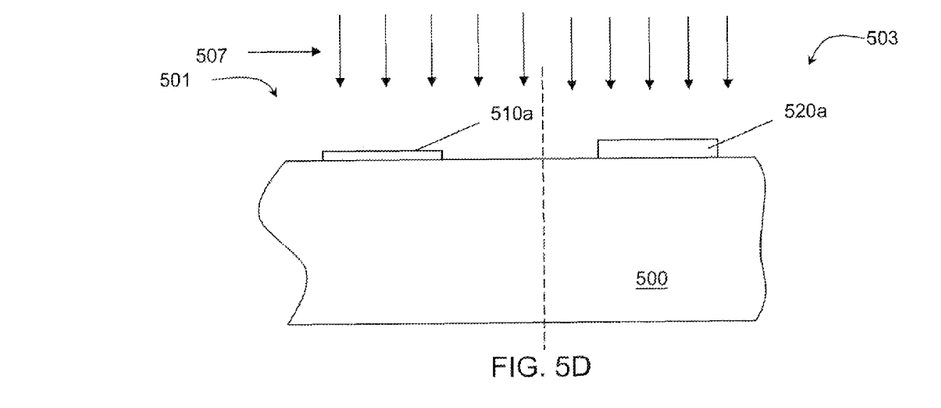
Figure 5E:
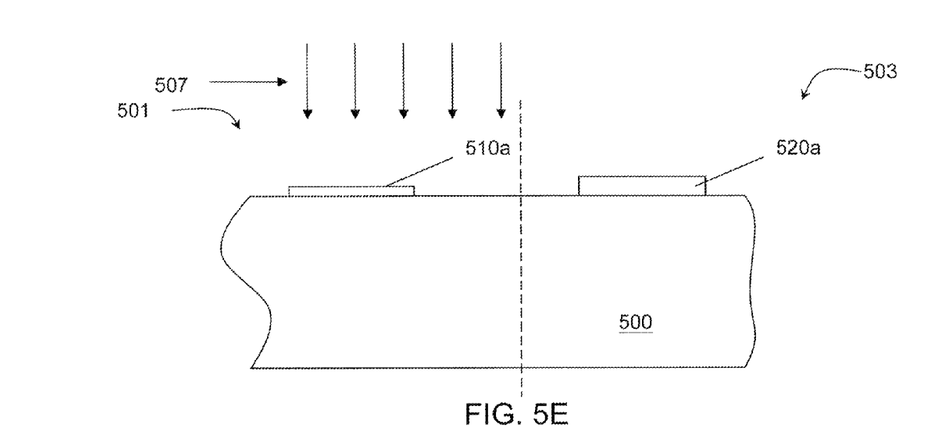

In some embodiments, the gate dielectric layers 510a and/or 520a are subjected to another ion process treatment 507, as shown in FIG. 5D described in connection with FIG. 2D. The another ion process treatment 507, such as ion implantation process or plasma process, is performed to introduce ions, such as germanium (Ge), strontium (Sr), aluminum (Al), tantalum (Ta), titanium (Ti), niobium (Nb), zirconium (Zr), hafnium (Hf) or other ion that is capable of increasing the dielectric constant of the gate dielectric layer 510a and/or 520a, into the gate dielectric layer 510a and/or 510a as shown in FIG. 5D. In another embodiment, the another process 330 using an ion source, such as nitrogen (N), to process the gate dielectric layer 320 that is capable of is capable of not only, increasing the dielectric constant of the gate dielectric layer 410 but also preventing doping penetration, for example boron penetrating, of following a implantation process on the transistor. After the on process treatment, the EOTs of the gate dielectric layers 510a and/or 520a can be further reduced. In other embodiments, the ion process treatment 507 can be performed on the gate dielectric layer 510a, but not on the gate dielectric layer 520a, as shown in FIG. 5E.

After the formation of the gate dielectric layers 510a and 520a, a conductive layer (not shown) provided to form the transistor gates 530 and 540 is formed over the gate dielectric layers 530a and 520a, respectively. The conductive layer may comprise, for example, a polysilicon layer, metal-containing layer or other conductive material layer which can be formed by, for example, a CVD process, physical vapor deposition (PVD) process or other film deposition process. A patterned photoresist layer (not shown) is then formed over the conductive layer. The patterned photoresist layer is defined corresponding to the dimensions of the transistor gates 530 and 540 shown in FIG. 5F. The patterned photoresist layer can be formed by, for example, a photolithographic process. An etch process using the patterned photoresist layer as a mask removes portions of the conductive layer and gate dielectric layers 510a and 520a, thereby patterning the transistor gates 530, 540 and the gate dielectric layers 510b, 520b. The patterned photoresist layer is then removed by, for example, a photoresist removal process. Another patterned photoresist layer (not shown) is formed over the substrate 500, defining areas corresponding to source/drain regions 550 and 560. At least one ion implantation process is performed to introduce dopants, e.g., boron (B), phosphorus (P) or arsenic (As), into the substrate 500 adjacent to the transistor gates 530 and 540. After the implantation process, the patterned photoresist layer is removed.

Figure 5F:
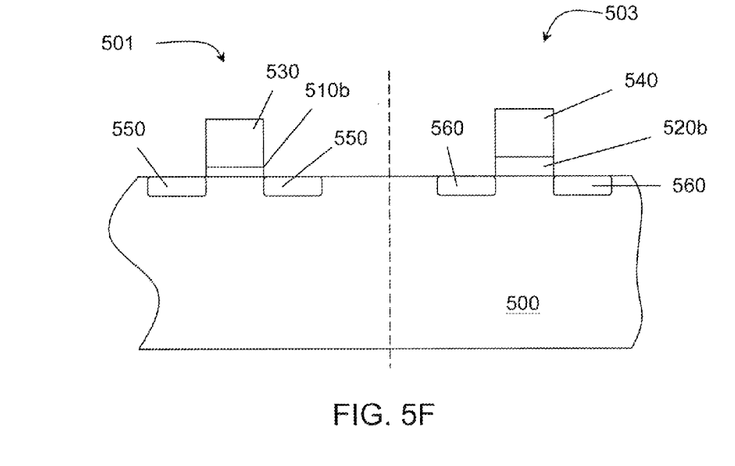

As set forth above, the gate dielectric layer 510b formed under the transistor gate 530 has thinner physical thickness and equivalent oxide thickness than those of the gate dielectric layer 520b formed under the transistor gate 540. With the desired EOTs and physical thicknesses, the transistors formed over the gate dielectric layers 510b and 520b can attain desired electrical performance and the gate dielectric layers 510b and 520b can tolerate voltages applied to the transistors.

FIGS. 6A-6D are cross-sectional views of a process for formation of another exemplary dual-gate dielectric structure over a substrate.

Figure 6A:
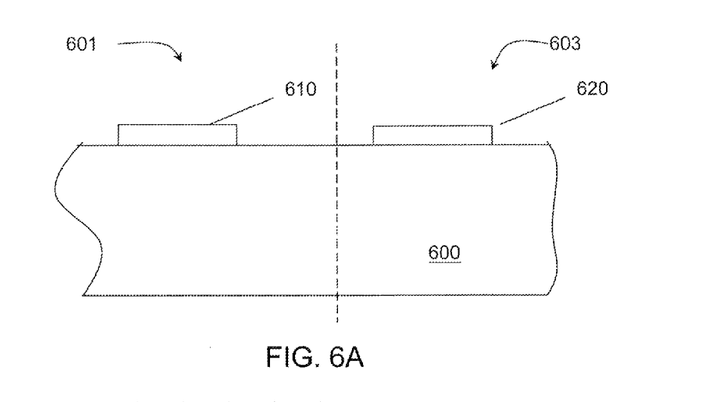
FIGS. 6A-6D are cross-sectional views of a process for formation of another exemplary dual-gate dielectric structure over a substrate.
Figure 6B:
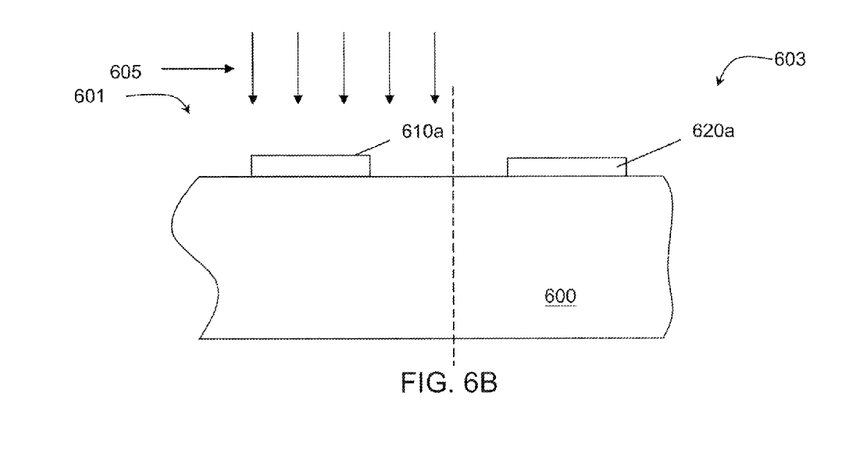
Figure 6C:
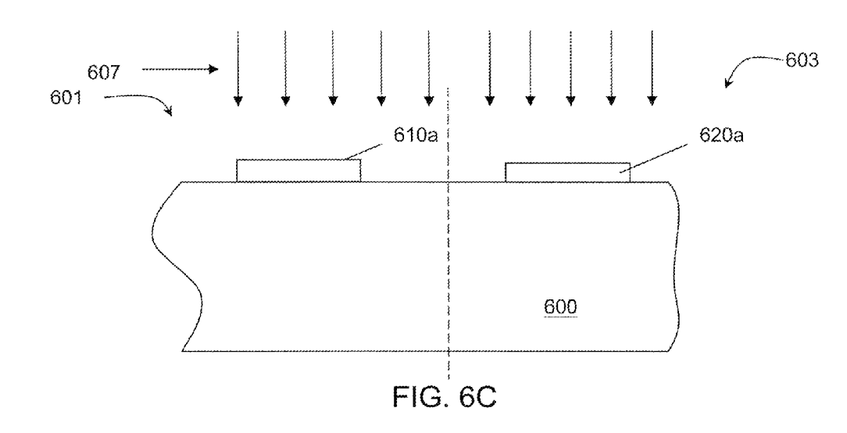

In some embodiments, as shown in FIG. 6A, the gate dielectric layers 610 and 620 are formed over regions 601 and 603 upon which a core transistor gate (not shown) and I/O transistor gate (not shown) are formed, respectively, have the substantially same physical thickness. The gate dielectric layer 610 is then subjected to the processing step 605, thereby providing the gate dielectric layer 610a, but the gate dielectric layer 620 is not, as shown in FIG. 6B. Since the dielectric constant of the gate dielectric layer 610a is enhanced, the EOT of the gate dielectric layer 610a is reduced. The processing step 605 is the same as, or similar to, the step 240 described above in connection with FIG. 2D. The gate dielectric layer 610a thus has a physical thickness which is substantially equivalent to that of the gate dielectric layer 62Q, and an EOT thinner than that of the gate dielectric layer 620. Therefore, the core transistor including the gate dielectric layer 610a can provide desired electrical performance and reduce current leakage through the gate dielectric layer 610a. In some embodiments, the gate dielectric layers 610a and/or 620 are subjected to another processing treatment 607, thereby yielding the gate dielectric layers 610b and 620a, as shown in FIG. 6C. In some embodiments, the processing treatment 607 is the same as, or similar to, the step 240 described above in connection with FIG. 21).

Figure 6D:
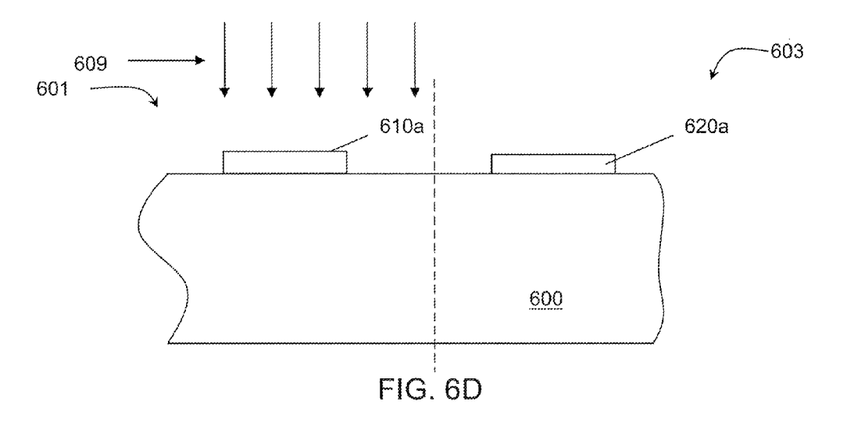

In still other embodiments, another processing treatment 609 may be performed on the gate dielectric layer 610b, thereby yielding the gate dielectric layer 610c, but not on the gate dielectric layer 620a, as shown in FIG. 6D The ion processing treatment 609 may be the same as, or similar to, the step 240 described above in connection with FIG. 2D.

Since each of the steps 605, 607 and 609 may desirably reduce the EOT of the original gate dielectric layers 610 and/or 620, the core transistor comprising the gate dielectric layer 610a, 610b or 610c can provide a desired electrical performance and desirably reduce current leakage.

The processes described in connection with FIGS. 2A-2E, 3A-3D and 4A-4D may be provided to form a triple-gate transistor structure (not shown) including, for example, a first device formed within a first core region, a second device formed within a second core region and an I/O device formed within an I/O region. The first, second and I/O devices have gate dielectric layers formed with different thicknesses gradually increased. In some embodiments, the first device may be a low-power device and the second device may be a high-performance device. The triple-gate transistor structure may be formed by a process analogous to that described in connection with FIGS. 5A-5F.

Although the present invention has been described in terms of exemplary embodiments, it is not limited thereto. Rather, the appended claims should be construed broadly to include other variants and embodiments of the invention which may be made by those skilled in the field of this art without departing from the scope and range of equivalents of the invention.

What is claimed is:

1. A method of forming a gate dielectric layer, comprising the steps of:
   (a) forming a gate dielectric layer over a substrate;
   (b) processing the gate dielectric layer with carbon-containing ions after step (a),
   (c) processing the gate dielectric layer with at least one ion source from the group consisting of nitrogen (N), germanium (Ge), calcium (Ca), scandium (Sc), strontium (Sr), yttrium (Y), lanthanum (La), aluminum (Al), tantalum (Ta), titanium (Ti), niobium (Nb), zirconium (Zr) and hafnium (Hf);
   (d) thermally processing the gate dielectric layer, thereby providing the gate dielectric layer with a level of carbon between about 1 atomic % and about 20 atomic %; and
   (e) forming a gate electrode above the gate dielectric layer.

2. The method of claim 1, wherein step (b) comprises an ion implantation processing step having an implantation energy of between about 0.5 KeV and about 8 KeV.

3. The method of claim 1, wherein step (b) comprises a plasma processing step having a plasma power of between about 5 watts and about 1,500 watts.

4. The method of claim 1, wherein the at least one ion source includes nitrogen (N).

5. The method of claim 1, wherein the thermally processing step comprises a rapid thermal anneal (RTA) step.

6. The method of claim 1, wherein the thermally processing step comprises a spike annealing processing step with an annealing time between about 1 millisecond and about 1 second.

7. The method of claim 1, wherein the thermally processing step provides a distribution profile of carbon having a peak within the gate dielectric layer.

8. The method of claim 1, wherein the ions from the ion source are implanted in a surface portion of the gate dielectric layer.

9. The method of claim 1, wherein the method is performed in the following sequence: step (a), then step (b), then step (c), and then step (d).

10. A method of forming a gate dielectric layer, comprising the steps of:
    (a) forming a gate dielectric layer over a substrate;
    (b) processing the gate dielectric layer with carbon-containing ions,
    (c) processing the gate dielectric layer with at least one ion source from the group consisting of nitrogen (N), germanium (Ge), calcium (Ca), scandium (Sc), strontium (Sr), yttrium (Y), lanthanum (La), aluminum (Al), tantalum (Ta), titanium (Ti), niobium (Nb), zirconium (Zr) and hafnium (Hf), wherein the ions from the ion source are implanted in a surface portion of the gate dielectric layer; and
    (d) thermally processing the gate dielectric layer, thereby providing the gate dielectric layer with a level of carbon between about 1 atomic % and about 20 atomic %,
    wherein the gate dielectric has a bottom region comprising carbon, in which fewer ions from the ion source are implanted, and the surface portion, in which a greater number of the ions from the ion source are implanted.

11. The method of claim 10, wherein step (b) comprises an ion implantation processing step having an implantation energy of between about 0.5 KeV and about 8 KeV.

12. The method of claim 10, wherein step (b) comprises a plasma processing step having a plasma power of between about 5 watts and about 1,500 watts.

13. The method of claim 10, wherein the at least one ion source includes nitrogen (N).

14. The method of claim 10, wherein the thermally processing step comprises a rapid thermal anneal (RTA) step.

15. The method of claim 10, wherein the thermally processing step comprises a spike annealing processing step with an annealing time between about 1 millisecond and about 1 second.

16. The method of claim 10, wherein the thermally processing step provides a distribution profile of carbon having a peak within the gate dielectric layer.

* * * * *